United States Patent
Hasegawa et al.

[11] Patent Number: 6,157,452
[45] Date of Patent: *Dec. 5, 2000

[54] POSITION DETECTING APPARATUS

[75] Inventors: Masanobu Hasegawa, Fujisawa; Kenji Saitoh, Atsugi, both of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/754,474

[22] Filed: Nov. 25, 1996

Related U.S. Application Data

[63] Continuation of application No. 08/330,543, Oct. 28, 1994, abandoned.

[30] Foreign Application Priority Data

Oct. 29, 1993 [JP] Japan ..................................... 5-293914

[51] Int. Cl.⁷ .................................................. G01B 11/00
[52] U.S. Cl. .......................................................... 356/401
[58] Field of Search .................................. 356/399–401; 250/548; 355/43, 53

[56] References Cited

U.S. PATENT DOCUMENTS

| | | |
|---|---|---|
| 4,037,969 | 7/1977 | Feldman et al. . |
| 4,514,858 | 4/1985 | Novak . |
| 5,162,656 | 11/1992 | Matsugu et al. . |
| 5,196,711 | 3/1993 | Matsugu et al. . |
| 5,200,800 | 4/1993 | Suda et al. . |
| 5,313,272 | 5/1994 | Nose et al. . |
| 5,333,050 | 7/1994 | Nose et al. . |
| 5,396,335 | 3/1995 | Hasegawa et al. ..................... 356/401 |
| 5,481,363 | 1/1996 | Matsugu et al. . |

FOREIGN PATENT DOCUMENTS

| | | |
|---|---|---|
| 56-157033 | 12/1981 | Japan . |
| 2-154102 | 6/1990 | Japan . |

*Primary Examiner*—Frank G. Font
*Assistant Examiner*—Layla Lauchman
*Attorney, Agent, or Firm*—Fitzpatrick, Cella, Harper & Scinto

[57] ABSTRACT

A position detecting system for detecting relative positional relationship between first and second objects disposed opposed to each other, includes a first mark formed on the first object and provided by a physical optic element, a second mark formed on the second object and provided by a physical optic element, a light projecting portion for projecting onto the first object a radiation beam having a predetermined light intensity distribution, a light detecting portion for detecting first light diffracted by the first mark and diffracted by the second mark, and second light diffracted by at least one of the first and second marks at a diffraction order different from that of the first light, an adjusting device for adjusting the position of incidence of the radiation beam upon the first object on the basis of first and second signals, of signals detected by the light detecting portion, corresponding to the first and second lights, respectively, and a determining portion for determining the relative positional relationship between the first and second objects on the basis of the detection of the first and second signals by the light detecting portions.

10 Claims, 9 Drawing Sheets

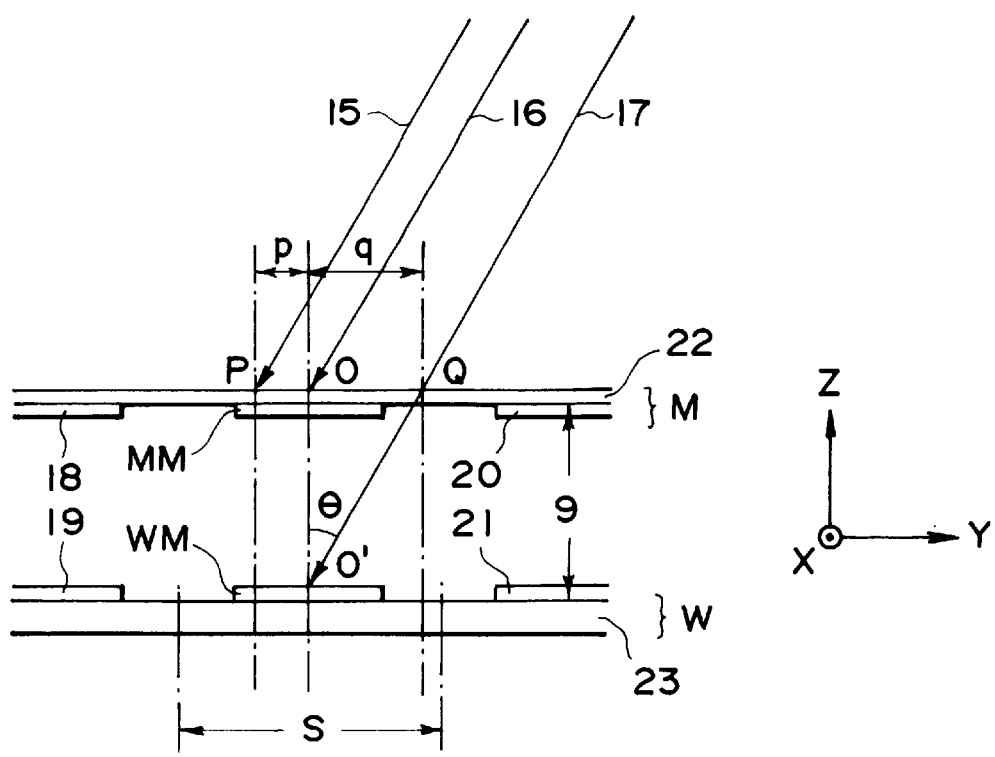
F I G. 4
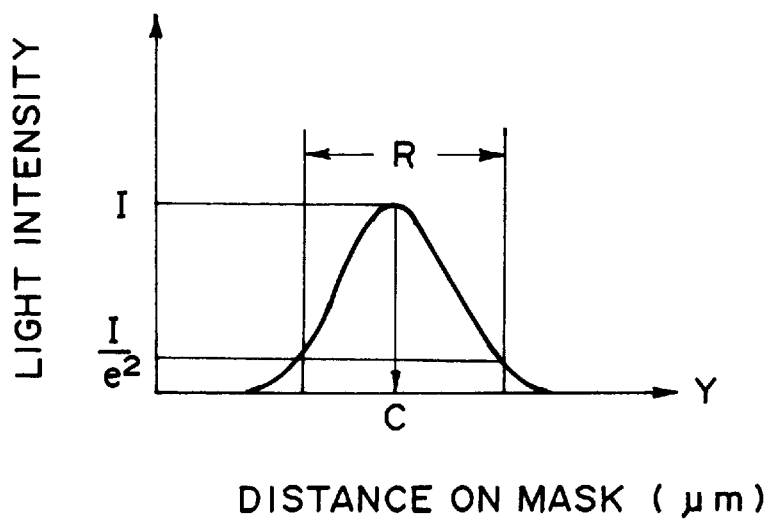
DISTANCE ON MASK (μm)
F I G. 5

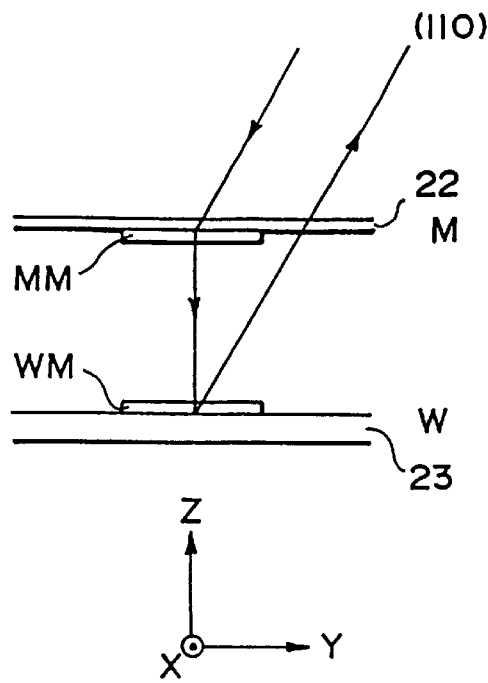
F I G. 6(A)
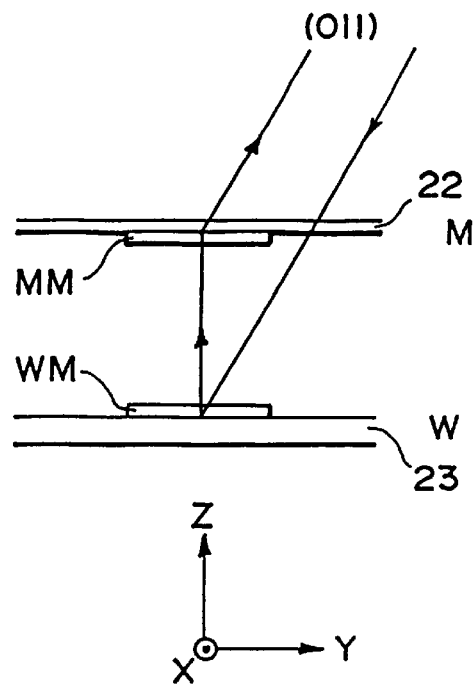
F I G. 6(B)
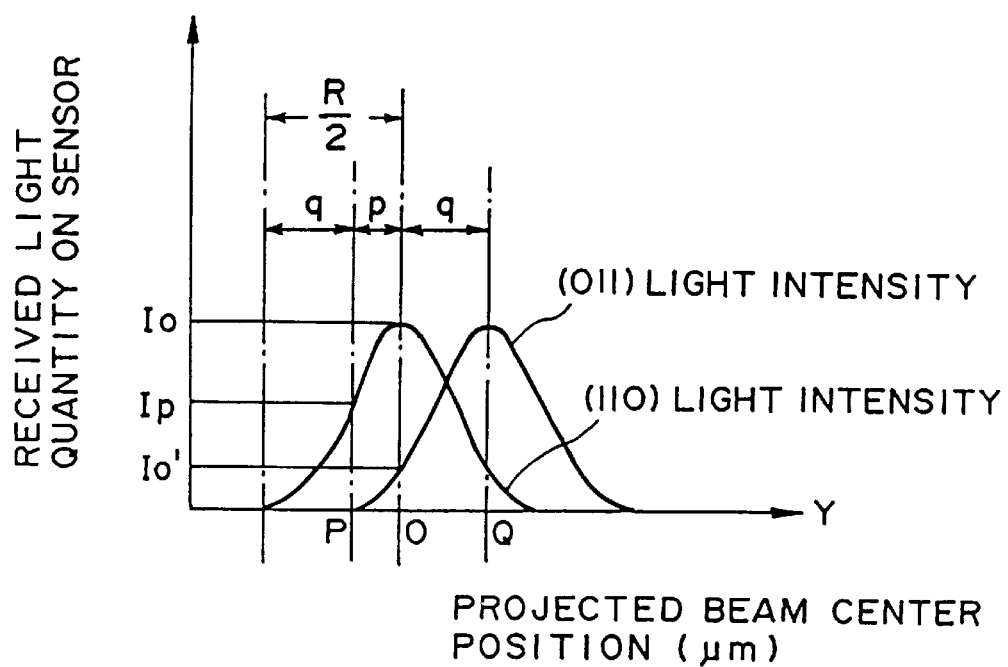
F I G. 7

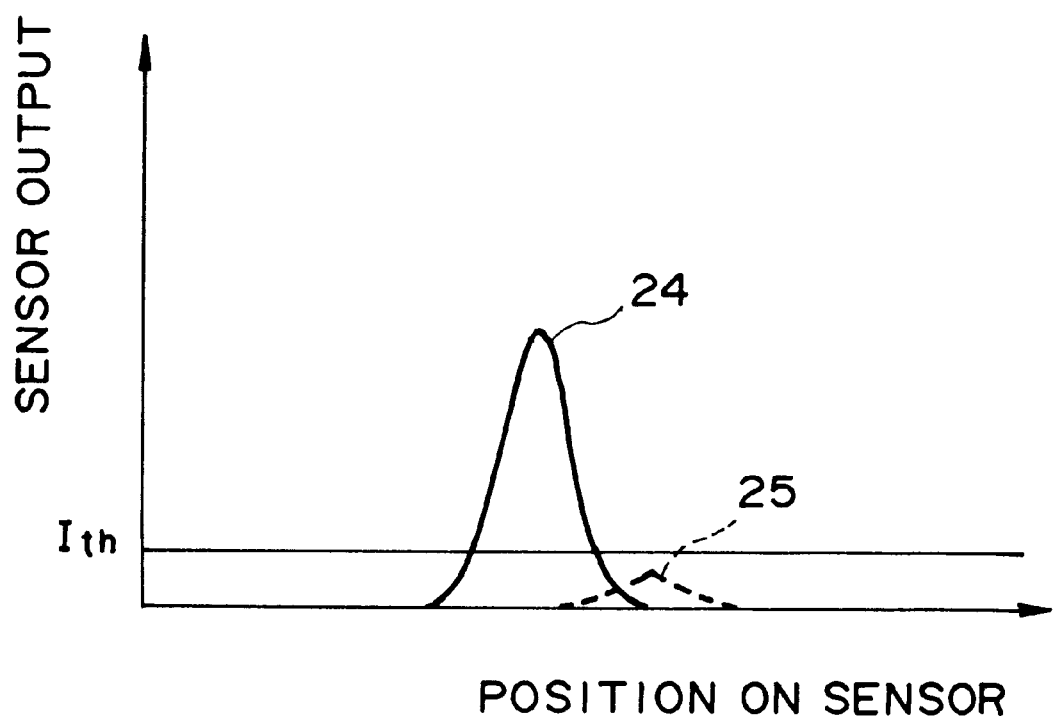
F I G. 8

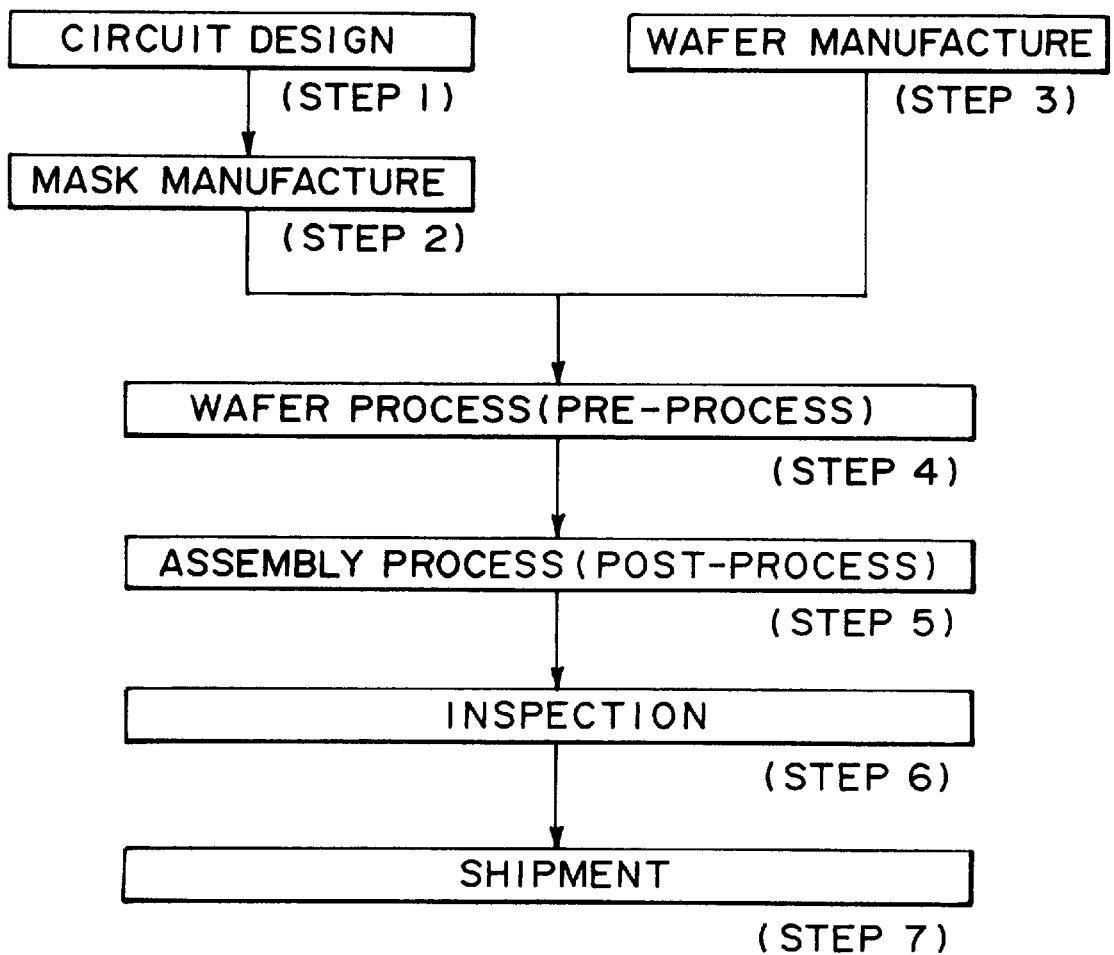
F I G. 10

POSITION DETECTING APPARATUS

This application is a continuation of application Ser. No. 08/330,543, filed Oct. 28, 1994, now abandoned.

FIELD OF THE INVENTION AND RELATED ART

This invention relates to a position detecting system and a semiconductor device manufacturing method using the same. The present invention is suitably usable, for example, in a semiconductor device manufacturing exposure apparatus for transferring, by exposure, a fine electronic circuit pattern formed on a first object such as a mask or reticle (hereinafter "mask") onto a second object such as a wafer, for detecting a relative positional deviation between the mask and the wafer and for positioning (aligning) them.

In semiconductor device manufacturing exposure apparatuses, relative alignment of a mask and a wafer is an important factor for improving the performance. Particularly, for this alignment process in recent exposure apparatuses, an alignment precision of a submicron or higher order is required in consideration of further increases in the degree of integration of each semiconductor device.

In many position detecting systems, alignment marks are provided on a mask and a wafer for positioning of them, and relative alignment of them is carried out by using positional information obtainable from these marks. As an example of such an alignment method, there is a method wherein relative deviation of alignment marks is detected on the basis of image processing. Another method is such as disclosed in U.S. Pat. Nos. 4,037,969 and 4,514,858 or in Japanese Laid-Open Patent Application, Laid-Open No. 157033/1981 wherein a zone plate is used as an alignment mark and light is projected to this zone plate, and a position of a light spot on a predetermined plane, formed by the light emitting from the zone plate, is detected.

Generally, an alignment method using a zone plate assures higher precision alignment as compared with an alignment method using a conventional alignment mark, because the former is less affected by any defect of the alignment mark.

FIGS. 1 and 2 are schematic views of a main portion of a position detecting system using a zone plate, of the type proposed in Japanese Laid-Open Patent Application, Laid-Open No. 154102/1990, filed in the name of the assignee of the subject application.

In the drawings, a mask M is mounted on a mask frame 12 which is supported by a main assembly 14 of an aligner through a mask chuck 13. Disposed at the top of the main assembly 14 is an alignment head 1. Alignment head 1 is mounted to stage member 100 for moving the alignment head 1. For the alignment of the mask M and a wafer W, mask alignment marks MM and wafer alignment marks WM are provided, by printing, on the mask M and the wafer W, respectively.

Light projected from a light source 2 is transformed by a light projecting lens 3 into a parallel light which goes through a half mirror 4 and impinges on the mask alignment mark MM. The mask alignment mark MM comprises a transmission type zone plate. It serves to diffract light incident thereon and functions as a convex lens such that positive first order diffraction light is focused at a point Q. The position of incidence of the light on the mask alignment mark MM can be adjusted by moving alignment head 1 using stage 100.

The wafer alignment mark WM comprises a reflection type zone plate. It serves to reflectively diffract the light focused at the point Q, and functions as a convex mirror (diverging function) to image the same upon a detection surface of detecting means 6.

Here, a signal light having been diffracted at a negative first order by the wafer alignment mark WM goes through the mask alignment mark MM without being influenced by its lens function, and thus it goes therethrough as a zeroth order light and is converged on the detection surface 5.

In the position detecting system illustrated in these drawings, if the wafer W is deviated relative to the mask M by a certain amount, the position of incidence of light (gravity center position of the light quantity) impinging on the detection surface 5 displaces in accordance with that positional deviation $\Delta\sigma w$. Here, there is a particular relationship between the displacement $\Delta\delta w$ upon the detection surface 5 and the positional deviation $\Delta\sigma w$, and thus, by detecting the displacement $\Delta\delta w$ on the detection surface 5, the relative positional deviation $\Delta\sigma w$ between the mask M and the wafer W is detected.

The position detecting system of this type adopts oblique light projection as illustrated in FIG. 2 wherein light from the light source 2 is projected obliquely upon the mask M surface. This prevents the light pickup (alignment head) 1, which is a light projecting and receiving system, from blocking the exposure area E, to thereby assure real-time alignment operation even during the exposure process.

In the alignment system of FIGS. 1 and 2, there are a plurality of diffraction lights being diffracted by the mask alignment mark of the mask and by the wafer alignment marks of the wafer. The alignment operation is carried out by using, of these diffraction lights, the diffraction light diffracted once by the mask alignment mark and once by the wafer alignment mark and, thereafter, passing the mask without being diffracted. This light can be considered as being diffracted at a positive first order by the mask alignment mark, being diffracted at a negative first order by the wafer alignment mark and then being diffracted at zeroth order by the mask alignment mark. Thus, it will be referred to hereinafter as "(1,1,0) light".

Actually, however, on the detection source there is other diffraction light of substantially the same intensity of the (1,1,0) light but not to be used in the alignment process, that is, such light having been diffracted by at least one of the mask and the wafer at an order different from that of the (1,1,0) light. An example is (0,1,1) light.

FIGS. 3A and 3B are graphs for explaining incidence positions, on the detection surface 5 of the detecting means (sensor), of the (1,1,0) light and the (0.1,1) light as well as output waveforms as produced by the sensor 6.

Since generally (excluding an unusual situation) these two lights, i.e., the (1,1,0) light and the (0,1,1) light, have different magnifications, the signal waveform from the sensor 6 has a profile such as shown in FIG. 3A or 3B. Without interference between the (1,1,0) light coming to the position A on the sensor (depicted by a broken line) and the (0,1,1) light coming to the position B on the sensor (depicted by a dash-and-dot line), the combined intensity is represented by the sum of the two signals, and a profile as depicted by a solid line is produced.

On the other hand, since the (1,1,0) light and the (0,1,1) light differ from each other in the point of the angle of incidence onto and the angle of emission from the wafer, the diffraction efficiency changes with a change in wafer process or a change in resist thickness. If as a result of this the intensity ratio of the (1,1,0) light and the (0,1,1) light changes such as shown in FIGS. 3A and 3B, the gravity position of a combined signal waveform changes apparently (Sa and Sb) even if the positions of respective signals are unchanged. Consequently, detection of mask-to-wafer positional information based on the gravity position of a signal on a sensor will face a problem of alignment error due to a change in diffraction efficiency caused by a difference in processing.

SUMMARY OF THE INVENTION

It is accordingly an object of the present invention to provide an improved position detecting system.

It is another object of the present invention to provide a position detecting system by which a relative position of first and second objects can be detected very precisely without being affected by a change in diffraction efficiency resulting from a difference in processing, this being able to be done by suitably adjusting the position of projection of light, from a light source, upon an alignment mark of the first object (mask) or the second object (wafer), and by which manufacture of semiconductor devices of high integration is facilitated.

It is another object of the present invention to provide a semiconductor device manufacturing method which uses such a position detecting system as described above.

In accordance with a first aspect of the present invention, there is provided a position detecting a system for detecting relative positional relationship between first and second objects disposed opposed to each other, said system comprising: a first mark formed on the first object and provided by a physical optic element; a second mark formed on the second object and provided by a physical optic element; light projecting means for projecting onto the first object a radiation beam having a predetermined light intensity distribution; light detecting means for detecting first light diffracted by the first mark and diffracted by the second mark, and second light diffracted by at least one of the first and second marks at a diffraction order different from that of the first light; adjusting means for adjusting the position of incidence of the radiation beam upon the first object on the basis of first and second signals, of signals detected by said light detecting means, corresponding to the first and second lights, respectively; and determining means for determining the relative positional relationship between the first and second objects on the basis of the detection of the first and second signals by said light detecting means.

In one preferred form of the present invention in this aspect, each of the first and second marks has a lens function.

In one preferred form of the present invention in this aspect, said adjusting means adjusts the incidence position of the radiation beam on the first object so that the detected second signal corresponding to the light intensity of the second light is brought into a predetermined relation with the detected first signal corresponding to the light intensity of the first light.

In one preferred form of the present invention in this aspect, said adjusting means adjust the incidence position of the radiation beam upon the first object, in a direction perpendicular to the direction with respect to which the relative position of the first and second objects is to be detected.

In one preferred form of the present invention in this aspect, said determining means includes means for setting a predetermined threshold to a signal detected by said light detecting means and for removing a component less than the threshold.

In accordance with a second aspect of the present invention, there is provided a position detecting method for detecting a relative positional relationship between first and second objects disposed opposed to each other, said method comprising: a first mark providing step for providing a physical optic element on the first object to define a first mark thereon; a second mark providing step for providing a physical optic element on the second object to define a second mark thereon; a light projecting step for projecting onto the first object a radiation beam having a predetermined light intensity distribution; a light detecting step for detecting first light diffracted by the first mark and diffracted by the second mark, and second light diffracted by at least one of the first and second marks at a diffraction order different from that of the first light; an adjusting step for adjusting the position of incidence of the radiation beam upon the first object on the basis of first and second signals, of signals detected by said light detecting step, corresponding to the first and second lights, respectively; and a determining step for determining, after said adjusting step, the relative positional relationship between the first and second objects on the basis of the detection of the first and second signals by said light detecting step.

In accordance with a third aspect of the present invention, there is provided an exposure apparatus for detecting a relative positional relationship between a mask and a wafer disposed opposed to each other and for subsequently transferring a pattern of the mask onto the wafer, said apparatus comprising: a first mark formed on the mask and provided by a physical optic element; a second mark formed on the wafer and provided by a physical optic element; light projecting means for projecting onto the mask a radiation beam having a predetermined light intensity distribution; light detecting means for detecting first light diffracted by the first mark and diffracted by the second mark, and second light diffracted by at least one of the first and second marks at a diffraction order different from that of the first light; adjusting means for adjusting the position of incidence of the radiation beam upon the mask on the basis of first and second signals, of signals detected by said light detecting means, corresponding to the first and second lights, respectively; and determining means for determining the relative positional relationship between the mask and the wafer on the basis of the detection of the first and second signals by said light detecting means.

In accordance with a fourth aspect of the present invention, there is provided a semiconductor device manufacturing method wherein a relative positional relationship between a mask and a wafer disposed opposed to each other is detected and a pattern of the mask is subsequently transferred to the wafer, and wherein the wafer is subsequently subjected to a developing process for the manufacture of semiconductor devices, said method comprising: a first mark providing step for providing a physical optic element on the mask to define a first mark thereon; a second mark providing step for providing a physical optic element on the wafer to define a second mark thereon; a light projecting step for projecting onto the mask a radiation beam having a predetermined light intensity distribution; a light detecting step for detecting a first light diffracted by the first mark and diffracted by the second mark, and a second light diffracted by at least one of the first and second marks at a diffraction order different from that of the first light; an adjusting step for adjusting the position of incidence of the radiation beam upon the mask on the basis of first and second signals, of signals detected by said light detecting step, corresponding to the first and second lights, respectively; and a determining step for determining, after said adjusting step, the relative positional relationship between the mask and the wafer on the basis of the detection of the first and second signals by said light detecting step.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is a schematic view of a main portion of a position detecting system according to a first embodiment of the present invention.

FIG. 5 is a graph for explaining an intensity distribution of light from light projecting means of FIG. 4.

FIGS. 6A and 6B are schematic views, respectively, for explaining paths of diffraction light being diffracted by an alignment mark of FIG. 4.

FIG. 7 is a graph for explaining the light reception on a detection surface of the position detecting system according to FIG. 4.

FIG. 8 is a graph for explaining incidence of light upon a detection surface, in a position detecting system according to a second embodiment of the present invention.

FIG. 10 is a flow chart of semiconductor device manufacturing processes.

DESCRIPTION OF THE PREFERRED EMBODIMENTS

FIG. 4 is a schematic view of a main portion of a position detecting system according to a first embodiment, and it illustrates the positional relationship between a mask M and a wafer W.

Figure 1:
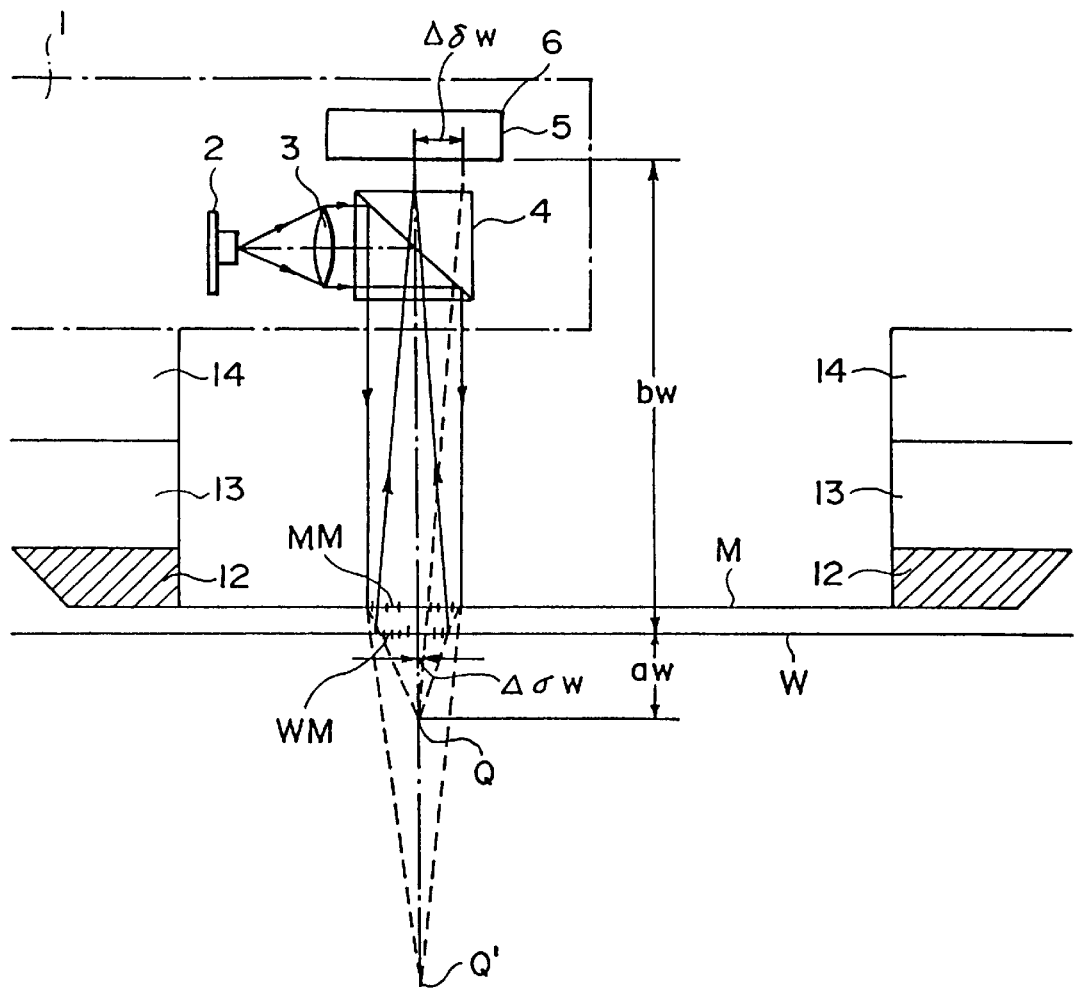
FIG. 1 is a schematic view of a main portion of a position detecting system of a known type.
Figure 2:
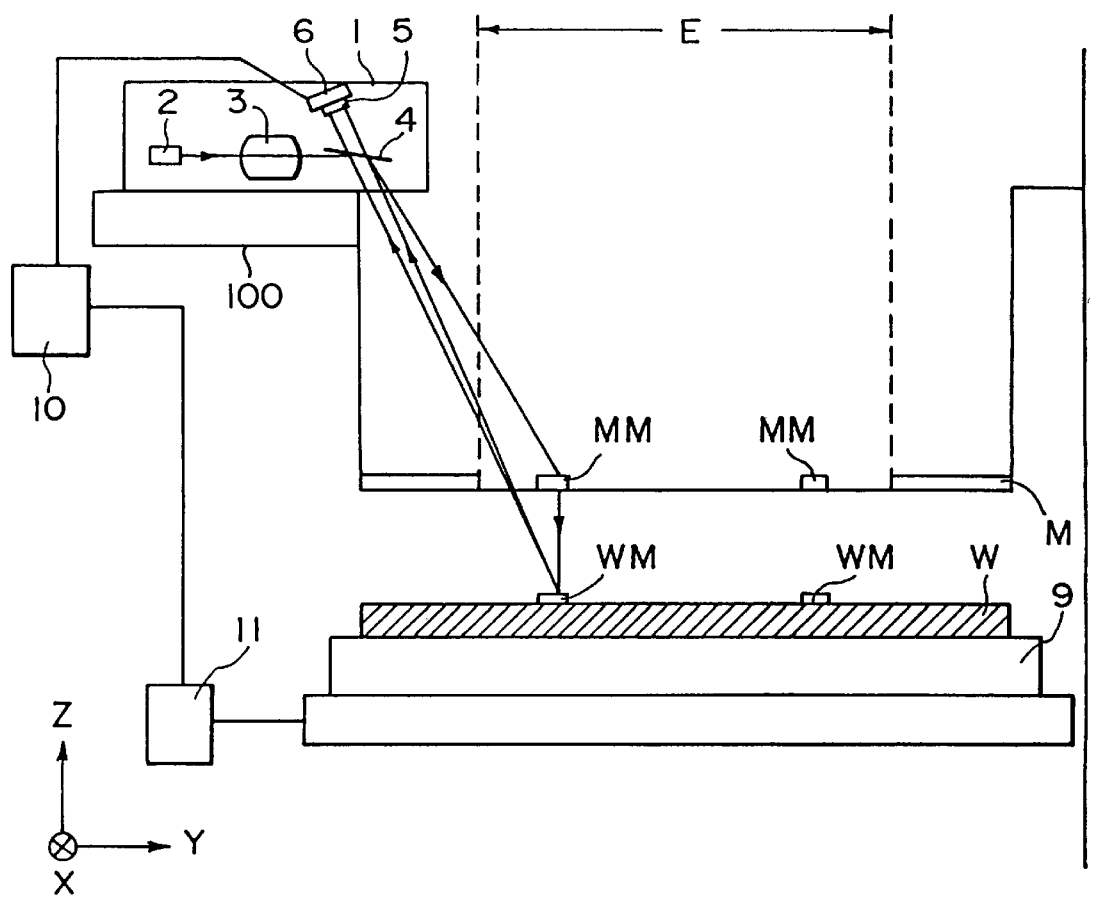
FIG. 2 is a schematic view of a main portion of a position detecting system of a known type.

The general structure of the system of this embodiment is similar to that of the system shown in FIGS. 1 and 2, but it differs in the point that the moving means (stage 100) for adjusting the position of incidence of light from a light source (light projecting means) upon the mask M is incorporated into a portion of an alignment head. The remaining portion has a similar structure. That is, the same alignment principle is used: the position of incidence upon the sensor 6 surface of the light coming from the mask alignment mark MM and the wafer alignment mark WM is detected.

Important features of this embodiment will be explained with reference to the drawings.

In FIG. 4, denoted at 22 is a membrane on which an integrated circuit pattern (elements 18 and 20) is formed. Denoted at 23 is a wafer on which an integrated circuit pattern (pattern elements 19 and 21) is already printed. Denoted at MM is an alignment mark on the mask side, and denoted at WM is an alignment mark on the wafer side. Denoted at 15, 16 and 17 are light rays each depicting the center of light projected. While the light is illustrated in the drawing by a line, actually it has an intensity distribution such as shown in FIG. 5, having a maximum strength on the line.

In this embodiment, light from the light source 2 having a light intensity distribution such as shown in FIG. 5 can be scanningly moved by moving means in the Y-axis direction as viewed in FIG. 4.

Here, FIG. 6A shows the (1,1,0) light, of the scanning light, which has been diffracted at a first order by the mask alignment mark MM on the mask M surface, diffracted at a negative first order by the wafer alignment mark WM on the wafer W surface and subsequently passed through the mask M. Similarly, FIG. 6B shows the (0,1,1) light which has passed through the mask M, has been diffracted at a negative first order by the wafer alignment mark WM on the wafer W surface and diffracted at a first order by the mask alignment mark MM on the mask M surface. The latter is an example of light (noise light) diffracted by at least one of the mask and the wafer at a diffraction order different from that of the signal light, that is, the (1,1,0) light.

FIG. 7 shows a light intensity distribution upon the detection surface 5, produced in response to impingement of the (1,1,0) light and the (0,1,1) light.

It is seen in FIG. 7 that the position corresponding to the peak of the intensity distribution of the (1,1,0) light and that of the (0,1,1) light are deviated from each other by a distance q. As shown in FIG. 4, in order to assure that the (1,1,0) light becomes highest, the center 16 of the light should well be projected toward the center of the mask mark MM. On the other hand, the (0,1,1) light becomes highest when the center 17 of the light is projected toward the center 0' of the wafer mark WM.

If the mask M and the wafer W are spaced by a gap g, the position coordinates on the mask M and the wafer W, corresponding to the highest intensities of these lights, have a mutual deviation:

$$OQ = q = g \times \sin \theta \quad (1)$$

Based on this finding, in this embodiment, only one of the (1,1,0) light and the (0,1,1) light is selectively extracted. More specifically, in this embodiment the position of beam projection is controlled to assure separate detection of the (1,1,0) light and the (0,1,1) light, to thereby remove the diffraction efficiency dependency of the alignment (AA) signal.

Usually, when light is to be projected onto a mark having been designed with respect to the (1,1,0) light, the light is projected toward the center O of the mask mark MM. However, as shown in FIG. 7, the (0,1,1) light is mixed, at the strength Io', into the signal light which is the (1,1,0) light.

This causes the diffraction efficiency dependency as described hereinbefore. However, if the light is projected with a shift of a distance p in the negative direction along the Y axis, there is a coordinate P at which the intensity of the (0,1,1) light can be disregarded substantially. For this reason, the beam may be positioned toward this coordinate P on the basis of the (1,1,0) light and the (0,1,1) light detected, where the strength of the (0,1,1,) light can be disregarded as compared with the strength of the (1,1,0) light. Then, the alignment light consists substantially of the (1,1,0) light only, and the diffraction efficiency dependency is removed. As a result, high precision alignment is assured.

If the width from the zero intensity to zero intensity of the light intensity distribution of the (1,1,0) light is denoted by R, the beam position correcting amount p is expressed by:

$$p = R/2 - q \quad (2)$$

If the mark is designed while taking the (0,1,1) light as signal light, the point P shifts in the positive direction along the Y axis by p from the point Q.

In this embodiment, as described above, the position of light projection from the light projecting means is adjusted on the basis of information related to the position of incidence of light upon the detection surface 5, and the relative position of the mask and the wafer is detected.

Next, a second embodiment of the present invention will be explained. The second embodiment differs from the first embodiment in the point that threshold method is used in the signal processing of the first embodiment. The remaining portion is substantially the same as the first embodiment.

Important features of this embodiment will be explained with reference to FIG. 8. FIG. 8 is a graph for explaining the incidence position of a beam upon the detection surface 5 of the sensor 6 as well as an output signal from the sensor 6.

In FIG. 8, denoted at 24 is the waveform of the (1,1,0) light, and denoted at 25 is the waveform of the (0,1,1) light. There is a case where, irrespective of adjustment of the beam position in the manner as described with reference to the first embodiment, there remains (0,1,1) light such as illustrated. On that occasion, the signal waveform as outputted from the sensor may be analog-to-digital converted, and a threshold Ith (FIG. 8) may be set to the thus obtained digital signal waveform so as to sufficiently remove the (0,1,1) light. The signal component less than the threshold Ith may be removed by using a processor, for example.

In this manner, in this embodiment the (0,1,1) light can be substantially completely extracted, and high precision alignment is assured.

Figure 3A:
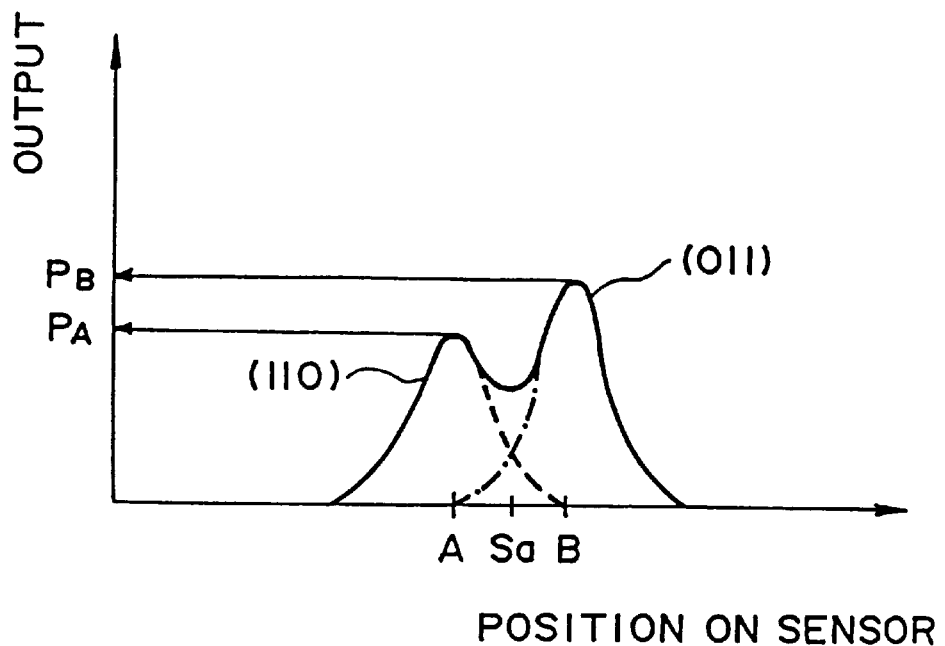
FIGS. 3A and 3B are graphs for explaining intensity distributions of light upon a detection surface.
Figure 3B:
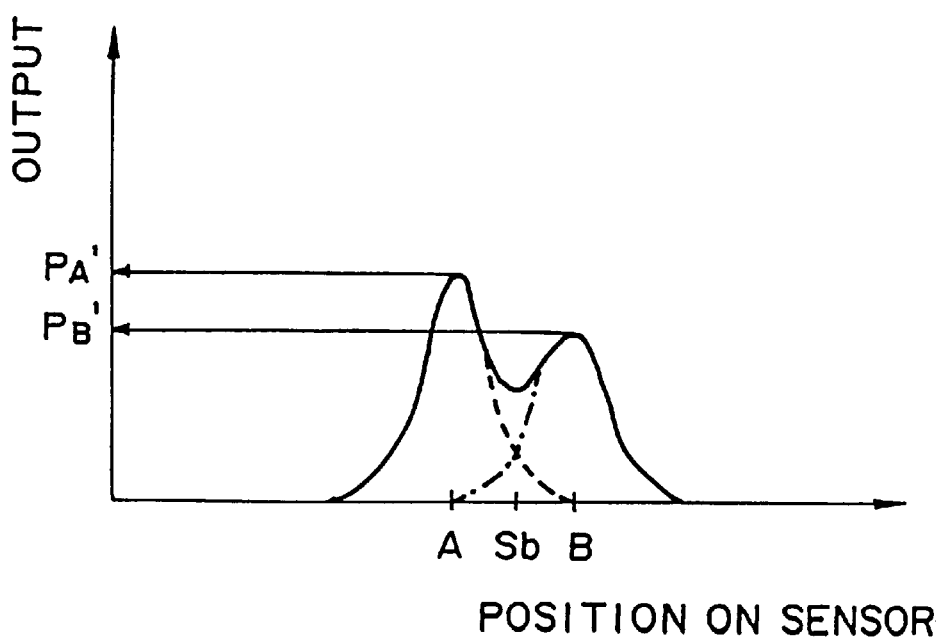

A third embodiment of the present invention will now be explained. In the third embodiment, the position of a projected beam is adjusted so as to adjust the intensity ratio between the (1,1,0) light and the (0,1,1) light to a particular proportion, to thereby remove the diffraction efficiency dependency. More specifically, while the waveform such as shown in FIG. 3 is changed from the state shown in FIG. 3A to the state shown in FIG. 3B with a change in diffraction efficiency of the wafer, it can be changed also by adjusting the position of a projected beam as illustrated in FIG. 6. Namely, a change in intensity ratio between the (1,1,0) light and the (0,1,1) light resulting from a change in diffraction efficiency can be compensated for by adjusting the position of the projected beam.

Thus, in the third embodiment, if the signal waveform is changed as a result of a change in diffraction efficiency, the beam position is adjusted to assure alignment processing with a stable waveform and, by doing so, high precision alignment of a mask and a wafer is accomplished.

Figure 9:
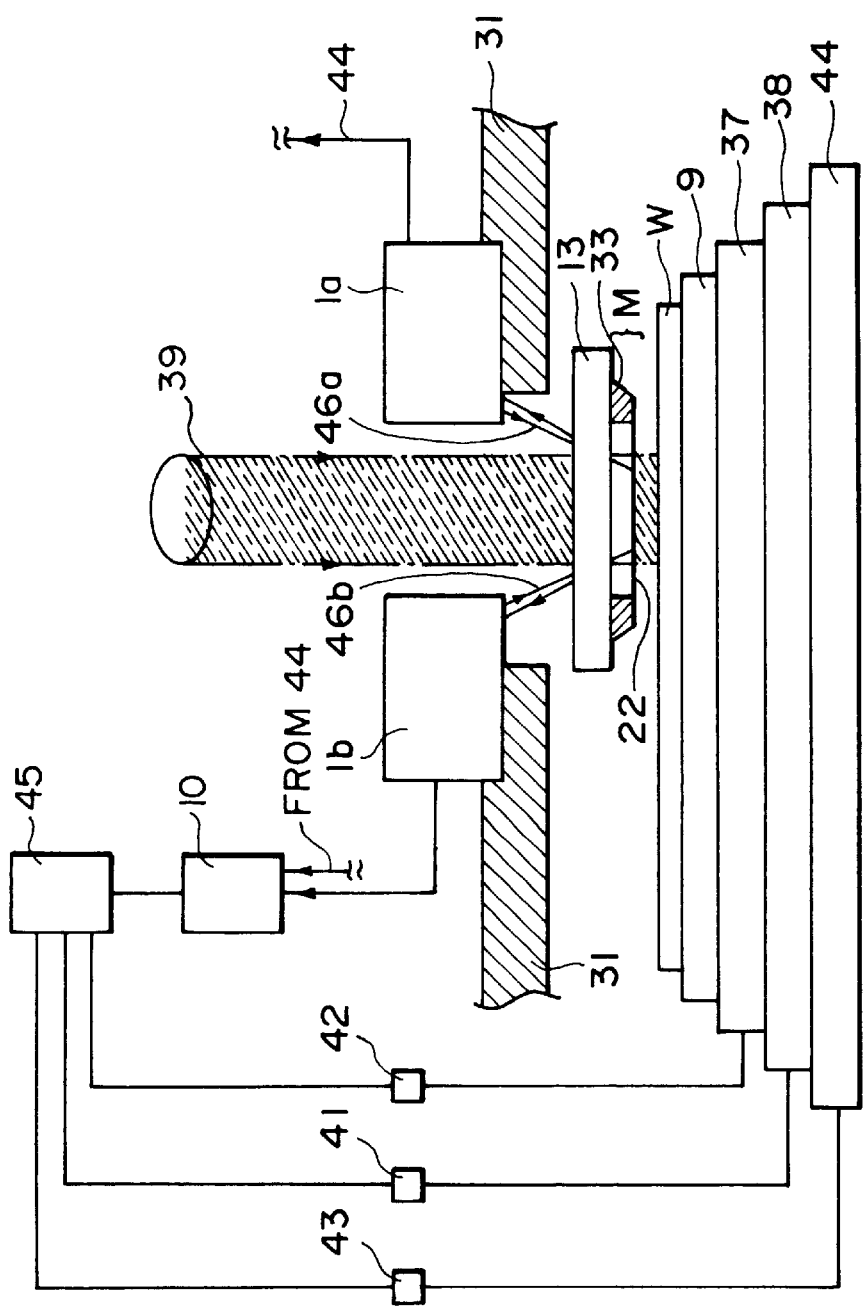
FIG. 9 is a schematic view of a main portion of an X-ray exposure apparatus having a position detecting system according to the present invention.

FIG. 9 is a schematic view of a main portion of a semiconductor device manufacturing exposure apparatus using X-rays, into which a position detecting system of the present invention is incorporated.

Denoted in FIG. 9 at 39 is an X-ray beam of substantially parallel light, which irradiates a mask 22 surface. Denoted at W is a wafer having a surface coated with an X-ray resist. Denoted at 33 is a mask frame, and denoted at 22 is a mask membrane (mask) having a surface patterned with an X-ray absorbing material to define a circuit pattern. Denoted at 13 is a mask supporting member, and denoted at 9 is a wafer fixing member such as a wafer chuck. Denoted at 37 is a Z axis stage, and denoted at 44 is a Y axis stage.

The mask-to-wafer alignment detection functional portion (position detecting means) such as described with reference to the preceding embodiments, is accommodated in housings 1a and 1b, from which the gap between the mask M and the wafer W as well as information related to the positional deviation between them along their surfaces are obtainable.

While FIG. 9 illustrates two alignment detection functional portions 1a and 1b, actually two additional alignment detection functional portions are provided, correspondingly to four sides of each IC circuit pattern area of square shape on the mask M. Each of the housings 1a and 1b accommodates therein an optical system and a detection system. Denoted at 46a and 46b are alignment detecting lights from these alignment systems, respectively.

Signals produced by these alignment detecting functional portions are processed by a signal processing means 10 to detect the deviation along the X-Y plane and the gap. The result is discriminated and, if the detection is out of a predetermined range, an appropriate one or ones of driving systems 42, 41 and 43 of the respective axis stages are actuated to reduce the error into a predetermined mask-to-wafer deviation range. After this, an X-ray exposure beam 39 is projected to the mask M. Before completion of alignment process, an X-ray blocking member (not shown) is used to prevent exposure. In FIG. 9, an X-ray source, an X-ray illumination system and other elements are not illustrated.

While the FIG. 9 embodiment has been described with reference to an example of a proximity type exposure apparatus, the invention is applicable in a similar way to an optical stepper. Also, the invention is applicable also to a stepwise motion type reduction projection exposure apparatus having and using a light source of i-line (365 nm), KrF excimer light (248 nm) or ArF excimer light (193 nm), for example, or to a unit-magnification exposure apparatus of mirror projection type.

Next, an embodiment of semiconductor device manufacturing method which uses a projection exposure apparatus such as described above, will be explained.

FIG. 10 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 11:
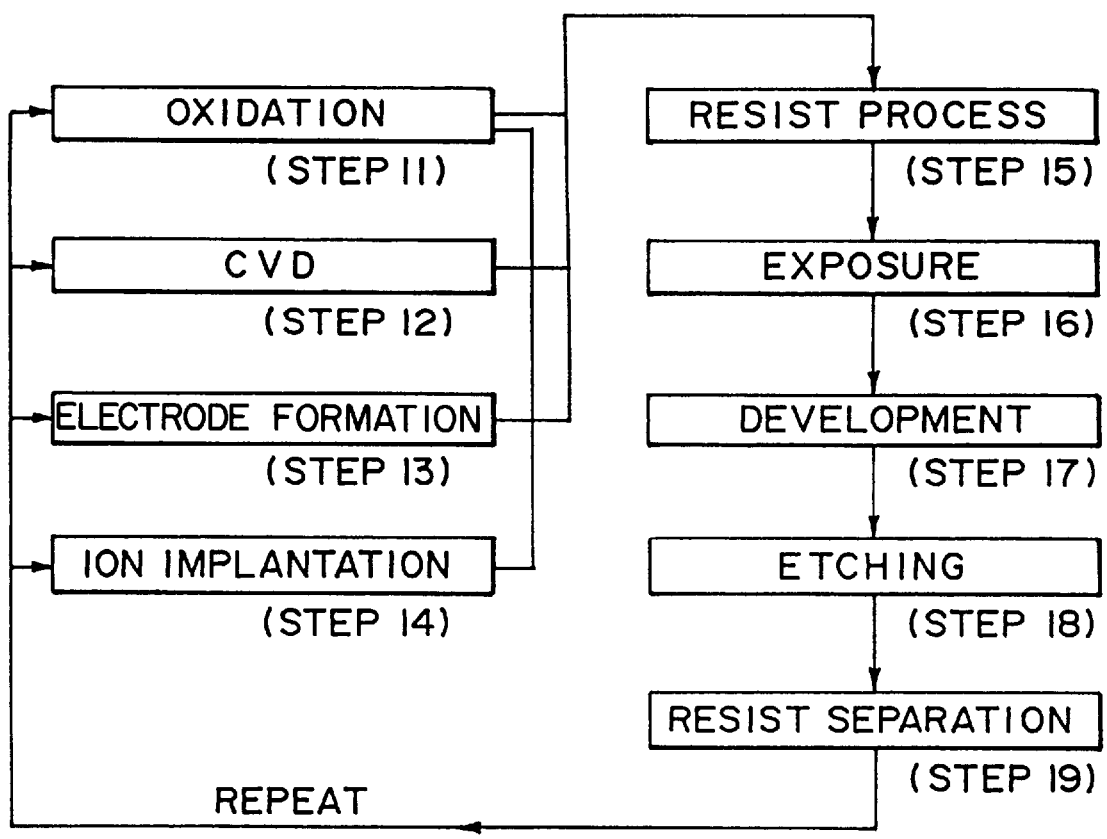
FIG. 11 is a flow chart of a wafer process.

FIG. 11 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A position detecting system for detecting a relative positional relationship between first and second objects disposed opposed to each other, said system comprising:

a first mark formed on the first object and provided by a physical optic element;

a second mark formed on the second object and provided by a physical optic element;

light projecting means for projecting onto the first object a radiation beam having a predetermined light intensity distribution;

light detecting means for detecting (i) first light diffracted by the first mark and diffracted by the second mark, to produce a first signal corresponding to the detected first light, and (ii) second light having been diffracted by the first and second marks in an order opposite to that of the first light, to thereby produce a second signal;

adjusting means for adjusting the position of incidence of the radiation beam upon the first object so as to reduce the second signal to be less than the first signal, in a state in which the first and second signals are at least substantially partially overlapped with each other, of signals produced by said light detecting means, corresponding to the second light; and determining means for determining the relative positional relationship between the first and second objects on the basis of the first and second signals produced by said light detecting means.

2. A system according to claim 1, wherein each of the first and second marks has a lens function.

3. A system according to claim 1, wherein said adjusting means adjusts the incidence position of the radiation beam upon the first object, in a direction perpendicular to the direction with respect to which the relative position of the first and second objects is to be detected.

4. A system according to claim 1, wherein said determining means comprises means for setting a predetermined threshold to a signal detected by said light detecting means and for removing a component less than the threshold.

5. A position detecting method for detecting a relative positional relationship between first and second objects disposed opposed to each other, said method comprising:

a first mark providing step for providing a physical optic element on the first object to define a first mark thereon;

a second mark providing step for providing a physical optic element on the second object to define a second mark thereon;

a light projecting step for projecting onto the first object a radiation beam having a predetermined light intensity distribution;

a light detecting step for detecting (i) first light diffracted by the first mark and diffracted by the second mark, to produce a first signal corresponding to the detected first light, and (ii) second light, having been diffracted by the first and second marks in an order opposite to that of the first light, to thereby produce a second signal;

an adjusting step for adjusting the position of incidence of the radiation beam upon the first object so as to reduce the second signal to be less than the first signal, in a state in which the first and second signals are at least substantially partially overlapped with each other, of signals produced in said light detecting step, corresponding to the second light; and a determining step for determining, after said adjusting step, the relative positional relationship between the first and second objects on the basis of the detection of the first and second signals produced in said light detecting step.

6. A method according to claim 5, wherein each of the first and second marks has a lens function.

7. A method according to claim 5, wherein in said adjusting step the incidence position of the radiation beam upon the first object is adjusted in a direction perpendicular to the direction with respect to which the relative position of the first and second objects is to be detected.

8. A method according to claim 5, wherein said determining step comprises setting a predetermined threshold to a signal detected in said light detecting step and removing a component less than the threshold.

9. An exposure apparatus for detecting a relative positional relationship between a mask and a wafer disposed opposed to each other and for subsequently transferring a pattern of the mask onto the wafer, said apparatus comprising:

a first mark formed on the mask and provided by a physical optic element;

a second mark formed on the wafer and provided by a physical optic element;

light projecting means for projecting onto the mask a radiation beam having a predetermined light intensity distribution;

light detecting means for detecting (i) first light diffracted by the first mark and diffracted by the second mark, to produce a first signal corresponding to the detected first light, and (ii) second light, having been diffracted by the first and second marks in an order opposite to that of the first light, to thereby produce a second signal;

adjusting means for adjusting the position of incidence of the radiation beam upon the mask so as to reduce the second signal to be less than the first signal, in a state in which the first and second signals are at least substantially partially overlapped with each other, of signals produced by said light detecting means, corresponding to the second light; and determining means for determining the relative positional relationship between the mask and the wafer on the basis of the first and second signals produced by said light detecting means.

10. A semiconductor device manufacturing method wherein a relative positional relationship between a mask and a wafer disposed opposed to each other is detected and a pattern of the mask is subsequently transferred to the wafer, and wherein the wafer is subsequently subjected to a developing process for the manufacture of semiconductor devices, said method comprising:

a first mark providing step for providing a physical optic element on the mask to define a first mark thereon;

a second mark providing step for providing a physical optic element on the wafer to define a second mark thereon;

a light projecting step for projecting onto the mask a radiation beam having a predetermined light intensity distribution;

a light detecting step for detecting (i) first light diffracted by the first mark and diffracted by the second mark, to produce a first signal corresponding to the detected first light, and (ii) second light, having been diffracted by the first and second marks in an order opposite to that of the first light, to thereby produce a second signal;

an adjusting step for adjusting the position of incidence of the radiation beam upon the mask so as to reduce the second signal to be less than the first signal, in a state in which the first and second signals are at least substantially partially overlapped with each other, of signals produced in said light detecting step, corresponding to the second light; and a determining step for determining, after said adjusting step, the relative positional relationship between the mask and the wafer on the basis of the first and second signals produced in said light detecting step.

* * * * *

UNITED STATES PATENT AND TRADEMARK OFFICE
CERTIFICATE OF CORRECTION

PATENT NO.    : 6,157,452
DATED         : December 5, 2000
INVENTOR(S)   : MASANOBU HASEGAWA, ET AL.

It is certified that error appears in the above-identified patent and that said Letters Patent is hereby corrected as shown below:

COLUMN 3:

Line 26, "a system" should read --system--.

Line 27, "relative" should read --a relative--.

COLUMN 8:

Line 33, "of" should read --of a--.

Signed and Sealed this

Fifth Day of June, 2001

Attest:

NICHOLAS P. GODICI

*Attesting Officer*

*Acting Director of the United States Patent and Trademark Office*